(12) United States Patent
Evans et al.

(10) Patent No.: US 7,561,118 B2
(45) Date of Patent: Jul. 14, 2009

(54) MULTIPLEXING

(75) Inventors: Duane Evans, Vancouver, WA (US); Geir Bjune, Vancouver, WA (US); Maxwell DeHaven, Vancouver, WA (US); Nikholas Hubbard, Vancouver, WA (US); Mark Lund, Vancouver, WA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 984 days.

(21) Appl. No.: 10/987,335

(22) Filed: Nov. 12, 2004

(65) Prior Publication Data

US 2006/0103558 A1    May 18, 2006

(51) Int. Cl.
  *G09G 3/00*   (2006.01)
  *G09G 5/00*   (2006.01)
  *G06F 3/038*  (2006.01)
(52) U.S. Cl. .................... 345/30; 345/33; 345/39; 345/204
(58) Field of Classification Search ........... 345/30–100, 345/204–214
See application file for complete search history.

(56) References Cited

U.S. PATENT DOCUMENTS

| | | | |
|---|---|---|---|
| 3,959,963 A | 6/1976 | Murrell | |
| 4,042,920 A | 8/1977 | Harsch et al. | |
| 4,362,398 A | 12/1982 | Jackson | |
| 4,471,293 A | 9/1984 | Schnack | |
| 4,677,308 A | 6/1987 | Wroblewski et al. | |
| 4,692,739 A | 9/1987 | Dorn | |
| 4,736,367 A | 4/1988 | Wroblewski et al. | |
| 4,998,119 A | 3/1991 | Collins et al. | |
| 5,845,136 A | 12/1998 | Babcock | |
| 5,938,772 A | 8/1999 | Welch | |
| 5,969,713 A | 10/1999 | Tomizawa et al. | |
| 5,977,937 A | 11/1999 | Michaelis | |
| 5,987,560 A * | 11/1999 | Gulick | 710/266 |
| 5,996,079 A | 11/1999 | Klein | |
| 6,255,960 B1 | 7/2001 | Ahne et al. | |
| 6,360,277 B1 | 3/2002 | Ruckley et al. | |
| 6,625,742 B1 | 9/2003 | Owhadi et al. | |
| 6,760,005 B2 | 7/2004 | Koyama et al. | |
| 6,998,871 B2 * | 2/2006 | Mulligan | 326/37 |
| 7,250,787 B2 * | 7/2007 | Mulligan | 326/41 |
| 7,372,430 B2 * | 5/2008 | Shinohara | 345/82 |

* cited by examiner

Primary Examiner—David L Lewis

(57) ABSTRACT

Embodiments of methods, apparatuses, systems and/or devices associated with multiplexing are disclosed.

19 Claims, 5 Drawing Sheets

| | A | C | D | B | E | F | | | | |
|---|---|---|---|---|---|---|---|---|---|---|
| Generic | Read sw2 @GPIOA<br>Read sw3 @GPIOC | Power | Ink | Read sw1 @GPIOA<br>Read sw4 @GPIOC | Paper | Mode 1 | Mode 2 | Mode 3 | Mode 4 | Spare |
| | Read switch 2 and 3 | LED8 | LED1 | Read switch 1 and 4 | LED 2 | LED 3 | LED 4 | LED 5 | LED 6 | LED 7 |
| GPIO A | ZR | 0 | 0 | ZR | Z | Z/1 | 0 | 1 | Z/1 | Z |
| GPIO B | 0 | 1 | Z | Z | Z | 0 | Z/0 | Z/0 | 1 | 1 |
| GPIO C | ZR | Z | Z | ZR | 0 | Z/1 | 1 | 0 | Z/1 | 0 |
| GPIO D | Z | Z | 1 | 0 | 1 | 1 | Z/0 | Z/0 | 0 | Z |
| | 2 ms | 2 ms | 2 ms | 2 ms | 2 ms | 2 ms | | | | |

15.0 ms

| | A | C | D | B | E | F | | | | |
|---|---|---|---|---|---|---|---|---|---|---|
| Generic | Read sw2 @GPIOA<br>Read sw3 @GPIOC | Power | Ink | Read sw1 @GPIOA<br>Read sw4 @GPIOC | Paper | Mode 1 | Mode 2 | Mode 3 | Mode 4 | Spare |
| | Read switch 2 and 3 | LED8 | LED1 | Read switch 1 and 4 | LED 2 | LED 3 | LED 4 | LED 5 | LED 6 | LED 7 |
| GPIO A | ZR | 0 | 0 | ZR | Z | 1 | 0 | 1 | 1 | Z |
| GPIO B | 0 | 1 | Z | Z | Z | 0 | 0 | 0 | 1 | 1 |
| GPIO C | ZR | Z | Z | ZR | 0 | 1 | 1 | 0 | 1 | 0 |
| GPIO D | Z | Z | 1 | 0 | 1 | 1 | 0 | 0 | 0 | Z |
| | | | | | 2 ms | 2 ms | | | | |

| States -> | Read Sw 5, 6, 8, 9 | Read Sw 4, 7, 10, 11 | Read Sw 0, 1, 12, 13, 14, 15 | Read Sw 2, 3, 16, 17, 18, 19 | LED 7, 15 | LED 0, 8 | LED 1, 9 | LED 2, 10 | LED 3, 11 | LED 4, 12 | LED 5, 13 | LED 6, 14 |
|---|---|---|---|---|---|---|---|---|---|---|---|---|
|  | READ 1 | READ 2 | READ 3 | READ 4 | LED 1 | LED 2 | LED 3 | LED 4 | LED 5 | LED 6 | LED 7 | LED 8 |
| GPIO 7 | ZR |  | Z | Z | Z | LED (8) | LED (9) | LED (10) | ZR | ZR | ZR | ZR |
| GPIO 6 | Z | ZR | Z | Z | Z | ZR |  | ZR | LED (11) |  | ZR |  |
| GPIO 5 |  | Z | Z | Z | LED (15) | ZR | ZR | ZR |  | ZR | LED (13) | LED (14) |
| GPIO 4 | Z | Z | Z |  |  |  | LED (0) | LED (1) | LED (2) |  | LED (12) | ZR | ZR |
| GPIO 3 | ZR | ZR | Z | Z | Z | ZR | ZR | ZR |  | ZR |  | ZR |
| GPIO 2 | Z | Z |  | ZR | LED (7) | ZR | ZR |  | LED (3) | ZR | ZR |  |
| GPIO 1 | ZR | ZR | Z | Z |  |  |  | ZR | ZR | ZR | LED (5) | LED (6) |
| GPIO 0 | Z | Z | Z | Z |  |  | ZR | ZR |  | LED (4) | ZR | ZR |
|  | A | B | C | D |  |  |  |  |  |  |  |  |

FIG. 5

MULTIPLEXING

BACKGROUND

Displays for computer peripherals, consumer electronic products, appliances and/or other such devices may employ a display having keys, buttons or the like that are pressed or actuated by a user. Such displays may include power consuming devices, including, for example, lighting elements, such as light emitting diodes (LEDs), to illuminate the function of the keys or buttons, for aesthetic purposes and/or to pass information to a user. However, as the complexity and number of components associated with these displays increases, so does the cost, such as for components associated with the keys and/or power consuming devices

BRIEF DESCRIPTION OF THE DRAWINGS

Subject matter is particularly pointed out and distinctly claimed in the concluding portion of the specification. Claimed subject matter, however, both as to organization and method of operation, together with objects, features, and advantages thereof, may best be understood by reference of the following detailed description when read with the accompanying drawings in which:

FIG. 3 is a table for the embodiment of FIG. 2;

FIG. 5 is a table for the embodiment of FIG. 4.

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, methods that would be understood by one of ordinary skill, procedures, components and/or circuits have not been described in detail so as not to obscure claimed subject matter.

Displays for computer peripherals, consumer electronic products, appliances and/or other such devices may employ a display having keys, buttons or the like that are pressed or actuated by a user. Such displays may include power consuming devices, including, for example, lighting elements, such as light emitting diodes (LEDs), to illuminate the function of the keys or buttons and likewise may include any relay or transducer, such as a switch or similar device, to effect a change in state when a particular button or key has been pressed. Likewise, such lighting elements may not be limited to visible light and may include ultraviolet and/or infrared light, for example. As such displays become more and more complex, additional relays and/or additional power consuming devices, as well as additional input/output pins, are included to meet the expectations of users and to increase the quality of their experience.

Figure 1:
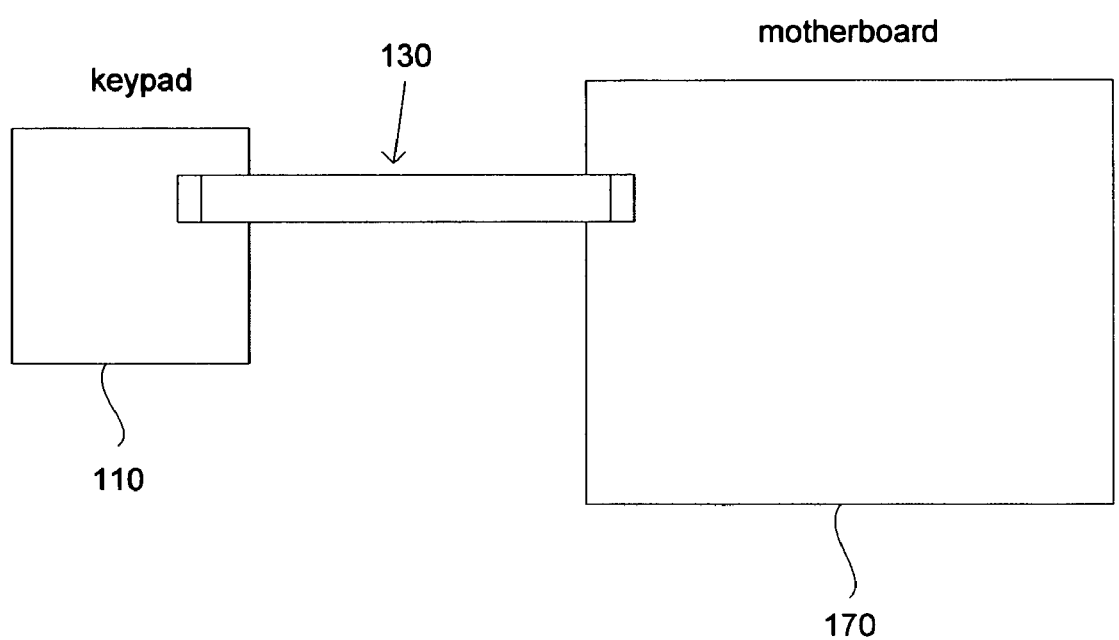
FIG. 1 is a schematic diagram illustrating an embodiment of a keyboard coupled to an embodiment of a motherboard.

Although claimed subject matter is not limited in scope in this respect, FIG. 1 is a schematic diagram illustrating an embodiment of a device or other system that includes a key pad 110 and motherboard 120. Embodiment 100 illustrates an interconnect 130 coupling key pad 110 to motherboard 120. Interconnect 130 here includes four connectors and wires. An interconnect, such as, for example, interconnect 130, may be employed to transmit signals from a key pad or display, such as 110, to a motherboard, such as 120, so that signals may be applied to the motherboard to perform operations. For example, on a printer, a button may be pressed to indicate, for example, light or dark printed, two-sided copying, color printing, and the like. Of course, these are just examples and claimed subject matter is not limited in scope to these examples or to merely a printer embodiment. As will become clear, it is desirable to reduce the number of interconnects between a user interface, such as key pad 110, and circuitry receiving such signals, such as 120. In this context, the term user interface refers to a device or a portion of a device with which a user may interact. For example, without limitation, a user interface may include an input device and/or an output device.

In such user interfaces, such as, for example, a DVD player, a stereo, a camera, a microwave, a set-top box, a cell phone, a PDA, a copier; a fax machine; a scanner; a printer; and/or any other consumer device, including combinations thereof, for example, power or current using or consuming devices may be included. For example, lighting elements may be included to light portions of the display indicating the function of buttons or keys associated with such functions. Likewise, such lighting elements may not be limited to visible light and may include ultraviolet and/or infrared light, for example. As indicated previously, one pin may be employed and an associated electrical conductor for a single switch, relay, or other transducer to convey or relay the results of pressing a button or key. However, as complexity increases in terms of the number of such relays and/or power consuming devices, such as switches and lighting elements, respectively, for example, likewise, the number of interconnects increases, increasing the cost of the overall product. In this context, the term interconnect refers to an electrical conductor. Likewise, as the number of interconnects increase, so do EMI related issues. Thus, reducing the number of interconnects may reduce noise leakage into the ambient environment.

Figure 2:
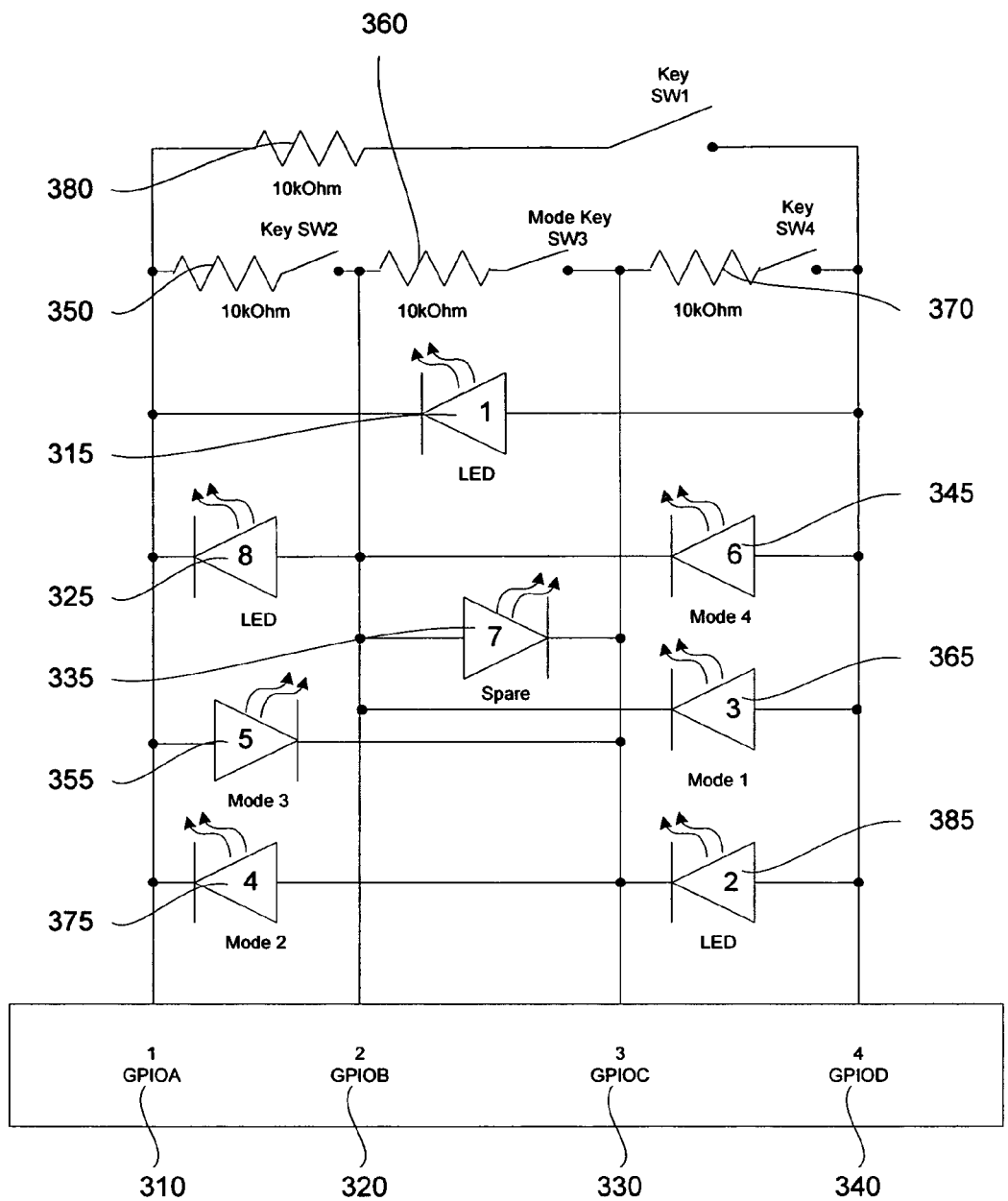
FIG. 2 is a schematic diagram illustrating an embodiment of a multiplexing circuit.

One approach to addressing the foregoing issues include multiplexing the reading of transducers, such as, here, switches, with the pulsing of power consuming elements, such as, here, the lighting or light emitting elements. FIG. 2 is a schematic of a circuit diagram illustrating an embodiment of a multiplexer circuit. Although claimed subject matter is not limited in scope in this respect, circuit embodiment 300 includes eight light emitting diodes, four switches, four GPIOs (general purpose input/output device), and four interconnects. Thus, circuit embodiment 300 employs LEDs 315, 325, 335, 345, 355, 365, 375, and 385. Likewise, circuit embodiment 300 includes GPIOs 310, 320, 330, 340 and switches 350, 360, 370 and 380.

Again, although, claimed subject matter is not limited in scope in this particular embodiment, circuit embodiment 300 couples the components together so that LEDs are given current-limited voltage pulses for relatively low duty cycles; however, at a rate sufficiently high to appear, that is to be perceived, as continuously lit to the unaided human eye, while the circuitry also reads switch states during the time at which the LEDs are not being pulsed. As will be discussed in detail hereinafter, this reduces interconnect, GPIO usage and addresses other issues discussed above. Thus, this may result in reduction over some implementations that do not implement the disclosed multiplexing. Likewise, as shall be discussed in more detail hereinafter, and illustrated, this approach reduces pin count, which may reduce the size of the integrated package, resulting in reduced packaging cost, as well as reducing the potential for EMI issues.

To provide sufficient current to light a particular light emitting diode, for this particular embodiment, approximately two volts is developed across an LED with a 50 ohm series resistance (here, a GPIO is assumed to have a resistance of approximately 25 ohms) drawing a 25 milliamp current. It is noted that, for the embodiment illustrated in FIG. 2, it is desirable for one GPIO to source current while another GPIO sinks current. Thus, sufficient current for a specific light emitting diode may be provided in such an embodiment. For example, referring to FIG. 2, for light emitting diode 335 to produce light, GPIO 320 should source current while GPIO 330 sinks current. For this particular embodiment, the voltage may be applied to an LED for a 2.0 millisecond period, here defined to be one time slot. In this particular embodiment, a cycle includes six time slots. Thus, a cycle occurs 55.5 times per second. If an LED is pulsed once per cycle, this provides approximately a 55.5 hertz rate. This should, therefore, result in the LED being pulsed sufficiently frequently to give the perception of a continuously lit LED to a user. Since a relatively short duty cycle is employed, the LEDs may be pulsed with sufficiently high current and sufficiently frequently to result in the LEDs appearing to be continuously lit. Of course, more frequent pulsing in such a situation should increase brightness, although the unaided human eye may or may not perceive it, due at least in part, for example, to non-linearity in user perception.

One aspect of this particular embodiment, as previously suggested, is the capability to read the state of the switches without significantly impacting the operation of the light emitting diodes. In this particular embodiment, this is accomplished at least in part with a 10 k ohm resistor in series with a keypad switch. This allows sufficient current for a change in state of the switch to be detected during a read state without perceivably impacting the brightness of the light emitting diodes during power consuming states of the LED. As explained in more detail below, for this embodiment, a GPIO determines whether the particular switch is open circuit or closed circuit. If it is closed circuit, current flows; however, if it is open circuit no current flows.

FIG. 3 is a table or timing diagram employed to illustrate the timing of reading the states of the switches and of pulsing the desired light emitting diodes. It is noted that, for this particular embodiment, at any given time, one LED will physically be lit. Of course, claimed subject matter is not limited in scope to this approach. All can be lit or the LEDs may be individually lit, for example. In this particular embodiment, for example, alternate print modes may be indicated by alternate light emitting diodes. Therefore, light emitting diodes 365, 355, 375 and 345 indicate alternate operational aspects of a particular device, such as a printer, for example, and diode 335 is a spare light emitting diode that may be employed for another currently undesignated purpose. Thus, at any given time, for example, light emitting diode 325 may indicate power, LED 385 may indicate the presence of paper, LED 315 may indicate the presence ink, and LED 345 may indicate a particular print mode, in this example.

Referring to FIG. 3, for this embodiment, pulsing of the LEDs is multiplexed with the reading of four user keypad switches. The time slots in which switches are read or polled are referred to as time slots A and B, respectively. Likewise, the remaining time slots are referred to as C, D, E, and F for this particular embodiment. It is noted here that any one of a number of different orders for pulsing and/or reading during particular time slots may be employed in alternative embodiments. Likewise, although this particular embodiment includes particular timing arrangements in a particular order with respect to which switches are read and which LEDs are pulsed, claimed subject matter is not limited in scope to this particular embodiment. All different arrangements and/or orders for pulsing and/or reading are included within the scope of claimed subject matter.

Referring to FIG. 3, the table entries for this embodiment mean the following: "0" means that the GPIO sinks current; "1" means the GPIO sources current; "Z" means the GPIO has the ability to read the state of a corresponding switch; "ZR" means that the GPIO reads the state of a corresponding switch; where entries are combined, e.g., Z/1, it means that either could be done in that time slot depending on the particular embodiment. Thus, beginning with time slot A, time slot switches 350 and 360 are read or polled. In particular, GPIO 310 reads the state of switch 350 and GPIO 330 reads the state of switch 360 in this embodiment. Likewise, GPIO 320 provides a substantially zero voltage or ground to permit switches 350 and 360 to be read by the aforementioned GPIOs, as previously described for this particular embodiment. Given the speed at which a cycle is completed, for this embodiment, during an instance in which a button, key, or other actuator may be pressed by a user, the change of the state of the switch will be detected for several successive reads. Thus, for this particular embodiment, a change of state of a switch may be detected, assuming a state change occurs for several successive reads of the particular switch. It is noted that, for this particular embodiment, the switches may comprise a spring loaded or similar switch so that the default state of the switch here is high and the state changes to low during the instance or time in which the key or other actuator is actually pressed or actuated by a user. Although, of course, it is appreciated that alternative switches and/or alternative conventions for signaling may be employed in alternative embodiments.

Referring now to time slot C of FIG. 3, as indicated, LED 325 is pulsed to designate, in this particular embodiment, power, although, of course, claimed subject matter is not limited in scope in this respect. To pulse LED 325, GPIO 320 sources current, while GPIO 310 sinks current, as indicated by FIG. 3. Likewise, at time slot D, LED 315 is pulsed. Similarly, to pulse this particular LED, GPIO 340 sources current, while GPIO 310 sinks current. At time slot B, switches 380 and 370 are read or polled, rather than switches 350 and 360, which were polled during time slot A. Thus, GPIOs 310 and 330 read the states of the switches, while GPIO 340 supplies a substantially zero voltage, to allow reading the state of the particular switches. Similarly, at time slot E, LED 385 is pulsed. Thus, GPIO 340 sources current, while GPIO 330 sinks current. Thus, for this particular embodiment, pulsing one or more LEDs may be employed to indicate various states of a printing system, such as ink present, power applied, paper present and/or one of several print modes selected, although claimed subject matter is not limited in scope in this respect.

For this particular embodiment, time slot F may include any one of five different signaling arrangements. Again, claimed subject matter is not limited in scope to this particular embodiment. However, as indicated, for example, in FIG. 3, LEDs associated with four different modes are capable of being lit; however, because, for this embodiment, the modes are mutually exclusive, one LED is lit, while the remaining LEDs are not lit. This is depicted in FIG. 3 by different columns shown under slot F in the table. In one embodiment, these modes may correspond to print modes in which a printing system can operate. Likewise, in this particular embodiment, a spare LED, such as LED 335 in FIG. 2, is also capable of being lit, to provide flexibility for changes in the design of the keypad, for example. Again, claimed subject matter is not limited in scope to this particular embodiment. For these particular LEDs, here 365, 375, 345 and 335, a similar approach as previously discussed is employed. More specifically, one GPIO sources current, while another GPIO sinks current, as indicated from the table in FIG. 3.

Multiple button presses or similar actuations are also capable of being detected by this particular embodiment. For example, as previously suggested, due to the relatively short duration of a cycle, multiple pulse cycles may be completed during the time that it takes a user to press a button, key or switch. Thus, the software and/or firmware driving the microprocessor may be programmed to recognize such multiple signals. It is noted, of course, that polling or reading of the states of the switches, such as those previously described, typically will be accomplished using a processor, such as a microprocessor, although claimed subject matter is not limited in scope to employing a microprocessor to accomplish the task. Thus, polling may consume some amount of processing capability of the processor. However, as should now be clear, the amount of processing by such a processor is relatively small and, therefore, should be nearly negligible when compared with the other tasks that the processor may be programmed to accomplish.

It is noted that a latency for a switch to change operation from sinking current to sourcing current, or vice-versa, may exist as the frequency of the time slots approaches a frequency at which the effects of parasitic capacitances in the circuitry become potentially significant. This may be addressed in this particular embodiment in several potential ways. For example, the firmware or software detecting changes in state may be programmed to take into account such a delay. Likewise, the particular groupings in the table of FIG. 3 may be arranged so that too many GPIO configurations do not change in a particular cycle. Thus, in this particular embodiment, a cycle is arranged to have two such reconfigurations, one for reading and one for pulsing. This thereby provides input functionality and output functionality.

It is, of course, noted that many alternative embodiments are possible within the scope of claimed subject matter. For example, the number of switches and LEDs may be altered, as well as the number of GPIOs. In general, with the approach previously described, up to a number of switches equal to [0.5×GPIO×(GPIO−1)] may be used, where GPIO equals the number of GPIO lines. This takes into account that two interconnects per switch are employed to read a switch. Likewise, with the approach previously described up to a number LEDs equal to [GPIO×(GPIO−1)−the number of switches] may be used, where GPIO equals the number of GPIO lines and the number of switches is determined as indicated. However, additional variations are possible and included within the scope of claimed subject matter. For example, in the previously described embodiment, no specific function is assigned to three switches being activated at substantially the same instance. Thus, to employ this unused combination of switches, a switch may be included in the circuitry tied to the three switches that are to be activated substantially simultaneously. Likewise, many other variations are possible, such as employing alternatively fewer LEDs and/or fewer switches, or alternatively more LEDs and/or more switches. Alternatively, additional switches may be included in place of some of the LEDs, although this should be done carefully since, depending on where such switches are placed, design tradeoffs may result. Nonetheless, any one of a number of different circuit configurations and/or timing configurations may be employed and are included within the scope of claimed subject matter.

Figure 4:
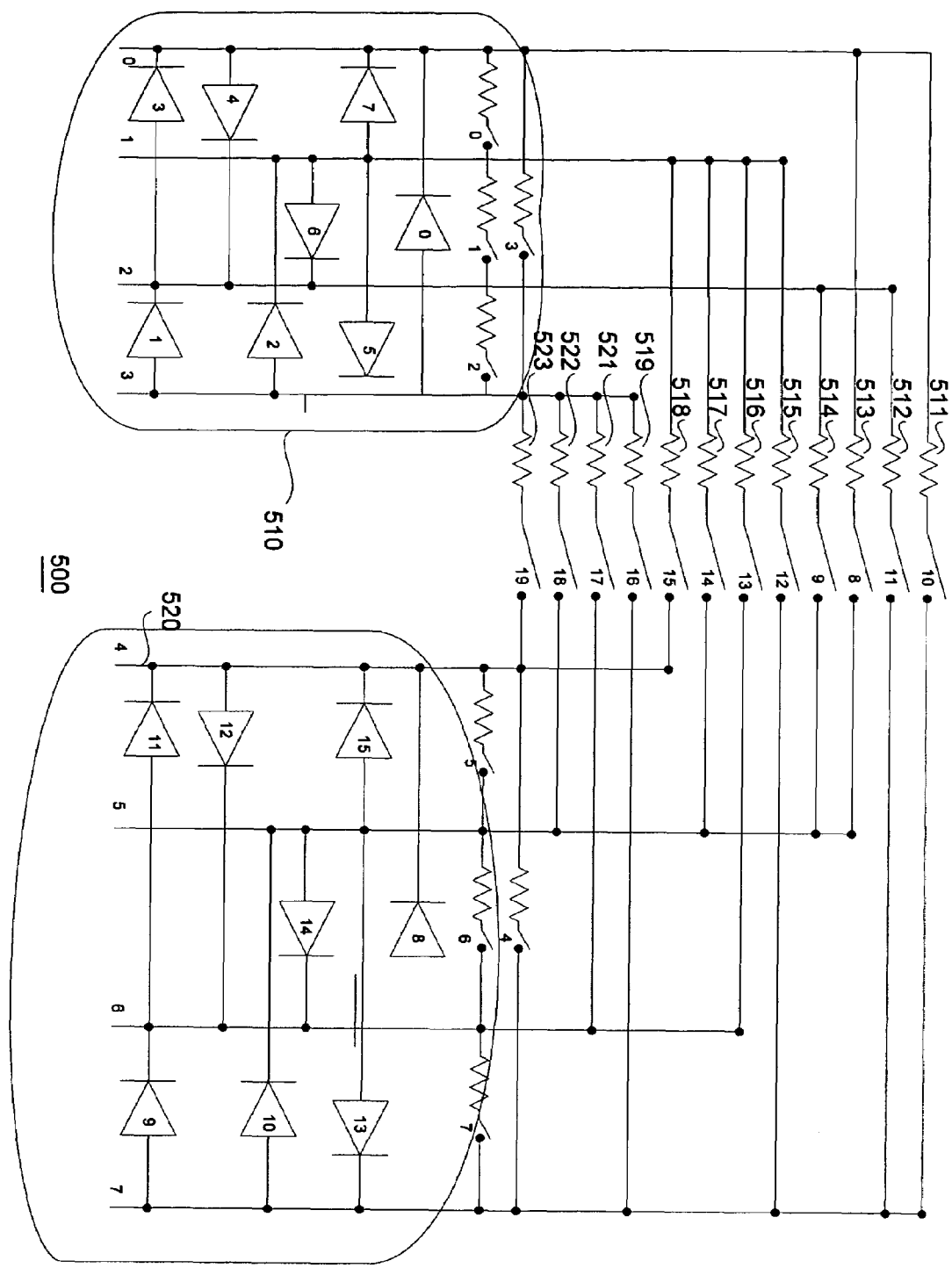
FIG. 4 is a schematic diagram illustrating another embodiment of a multiplexing circuit and associated table, here a scalable multiplexing circuit.

FIG. 4 is a circuit diagram and FIG. 5 is a corresponding table illustrating yet another embodiment. It is noted that the circuit embodiment illustrated in FIG. 4 includes the embodiment of FIG. 2 as a part of the configuration. It is noted that, for this embodiment, lines in FIG. 4 labeled 0-7 correspond to GPIO lines 0-7 in FIG. 5. Specifically, the circuitry configuration of FIG. 2 is repeated and mutually coupled by a plurality of switches. Thus, circuit embodiment 500 includes circuitry configuration 510 and circuitry configuration 520 coupled by switches 511 to 523. Of course, claimed subject matter is not limited in scope to the number of switches employed to couple configurations 510 and 520 and, likewise, claimed subject matter is not limited in scope to a particular number of such configurations that may be included in a single circuit embodiment. Likewise, claimed subject matter is not limited in scope to employing the configuration of FIG. 2. However, in this embodiment, scalability is available, meaning many circuit configurations similar to the configuration of FIG. 2 may be employed in one circuit embodiment, such as in the manner illustrated in FIG. 4, for example.

As illustrated by the table in FIG. 5, this particular embodiment employs twelve time slots and these time slots are not of equal size, unlike in FIG. 3. As illustrated, the time slots in which switches are polled last longer than the time slots in which LEDs are pulsed. Again, as previously described, as in connection with the embodiment in FIG. 2, claimed subject matter is not limited in scope to a particular arrangement of pulsing and/or polling. For example, in an alternative embodiment to that illustrated in FIG. 4, it may be appropriate to poll two switches respectively from 510 and 520, concurrently, and during another time slot, poll another two switches in these corresponding configurations. On other time slots, switches 511-523 may be polled as well. This approach, for example, provides the capability to read the states of the switches of the configurations of 510 and 520 in a manner similar to that previously discussed, while also, in effect, addressing switches 511 to 523 by a particular time slot.

It will, of course, also be understood that, although particular embodiments have just been described, claimed subject matter is not limited in scope to a particular embodiment or implementation. For example, one embodiment may be in hardware, such as implemented on a device or combination of devices, as previously described, for example. Likewise, although claimed subject matter is not limited in scope in this respect, one embodiment may comprise one or more articles, such as a storage medium or storage media. This storage media, such as, one or more CD-ROMs and/or disks, for example, may have stored thereon instructions, that when executed by a system, such as a computer system, computing platform, or other system, for example, may result in an embodiment of a method of operating a termination scheme being executed, such as one of the embodiments previously described, for example. As one potential example, a computing platform may include one or more processing units or processors, one or more input/output devices, such as a display, a keyboard and/or a mouse, and/or one or more memories, such as static random access memory, dynamic random access memory, flash memory, and/or a hard drive, although, again, claimed subject matter is not limited in scope to this example.

In the preceding description, various embodiments of claimed subject matter have been described. For purposes of explanation, specific numbers, systems and/or configurations were set forth to provide a thorough understanding of claimed subject matter. However, it should be apparent to one skilled in the art having the benefit of this disclosure that claimed subject matter may be practiced without the specific details.

In other instances, details that would be understood by one of ordinary skill were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all such modifications and/or changes as fall within the true spirit of claimed subject matter.

The invention claimed is:

1. A method for controlling a circuit, the method comprising:
providing a multiplexer circuit comprising user-actuable switches, light-emitting elements associated with the user-actuable switches, and interconnects shared by the user-actuable switches and the light-emitting elements; and
controlling the multiplexer circuit in a repeating cycle divided into multiple time slots, the controlling comprising:
pulsing a selected light-emitting element during a first time slot of the repeating cycle, and
reading the state of a selected switch during a second time slot different from the first time slot,
such that the pulsing and reading are repeatedly performed during the controlling in an alternative manner and the selected light-emitting element is powered for only a portion of each repeating cycle to enable reading the state of the selected switch using the shared interconnects while the selected light-emitting element is not powered during the repeating cycle.

2. The method of claim 1, wherein providing further comprises providing input/output devices, one input/output device being provided for each interconnect.

3. The method of claim 1, wherein controlling comprises alternately pulsing a light-emitting element and reading the state of a switch during the time slots of each repeating cycle.

4. The method of claim 1, wherein controlling comprises pulsing only one light-emitting element per repeating cycle.

5. The method of claim 1, wherein controlling comprises pulsing the selected light-emitting element only once each repeating cycle.

6. The method of claim 1, wherein pulsing a light-emitting element comprises pulsing the light-emitting element at a frequency at which the light-emitting element appears to be continuously illuminated to a human observer.

7. The method of claim 1, wherein controlling comprises reading the state of multiple switches in each repeating cycle.

8. The method of claim 1, wherein controlling comprises reading the state of each switch in each repeating cycle.

9. The method of claim 1, wherein the repeating cycle repeats over 50 times each second.

10. A multiplexer circuit comprising:
user-actuable switches;
light-emitting elements that are illuminated when associated user-actuable switches are actuated;
interconnects shared by the user-actuable switches and the light-emitting elements such that voltage can be alternatively applied to the user-actuable switches and the light-emitting elements and the number of interconnects is fewer than the total number of user-actuable switches and light-emitting elements;
input/output devices associated with the interconnects, the input/output devices being configured to control the multiplexer circuit in a repeating cycle divided into multiple time slots by:
pulsing a selected light-emitting element during a first time slot of the repeating cycle, and
reading the state of a selected switch during a second time slot different from the first time slot,
such that the pulsing and reading are repeatedly performed in an alternative manner and the selected light-emitting element is powered for only a portion of the repeating cycle to enable reading the state of the selected switch using the shared interconnects while the selected light-emitting element is not powered during the cycle.

11. The circuit of claim 10, wherein the interconnects are electrical conductors.

12. The circuit of claim 10, wherein one input/output device is provided for each interconnect.

13. The circuit of claim 10, wherein the input/output devices are configured to alternately pulse a light-emitting element and read the state of a switch during the repeating cycle.

14. The circuit of claim 10, wherein the input/output devices are configured to pulse the selected light-emitting element only during one time slot of the repeating cycle.

15. The circuit of claim 10, wherein the input/output devices are configured to pulse the selected light-emitting element at a frequency at which the light-emitting element appears to be continuously illuminated to a human observer.

16. The circuit of claim 10, wherein the input/output devices are configured to read the state of each switch in each repeating cycle.

17. The circuit of claim 10, wherein the input/output devices are configured to read the state of multiple switches in a time slot of the repeating cycle.

18. An electronic device comprising:
a user interface including multiple user-selectable buttons and a display; and
a multiplexer circuit including:
switches associated with the buttons;
light-emitting elements associated with the display;
interconnects shared by the switches and the light-emitting elements such that voltage can be alternatively applied to the switches and the light-emitting elements to reduce the number of interconnects;
input/output devices associated with the interconnects, the input/output devices being configured to control the multiplexer circuit in a repeating cycle divided into multiple time slots by:
pulsing a selected light-emitting element during a first time slot of the repeating cycle, and
reading the state of a selected switch during a second time slot different from the first time slot,
such that the pulsing and reading are repeatedly performed in an alternative manner and the selected light-emitting element is powered for only a portion of the repeating cycle to enable reading the state of the selected switch using the shared interconnects while the selected light-emitting element is not powered during the cycle.

19. The electronic device of claim 18, wherein the device is one of a DVD player, a stereo, a camera, a microwave, a set-top box, a cell phone, a PDA, a copier, a fax machine, a scanner, or a printer.

* * * * *